United States Patent [19]

Sheen et al.

[11] Patent Number: 5,572,474
[45] Date of Patent: Nov. 5, 1996

[54] PSEUDO-DIFFERENTIAL SENSE AMPLIFIER

[75] Inventors: Ben Y. Sheen, Milpitas; Timothy M. Lacey, Cupertino; Sammy Cheung, Pleasanton, all of Calif.

[73] Assignee: Cypress Semiconductor Corporation, San Jose, Calif.

[21] Appl. No.: 503,807

[22] Filed: Jul. 18, 1995

[51] Int. Cl.$^6$ .................................................. G11C 13/00
[52] U.S. Cl. ...................................... 365/207; 365/189.01
[58] Field of Search ............................... 307/530, 279, 307/578; 365/206, 207, 189.01, 230.01

[56] References Cited

U.S. PATENT DOCUMENTS 5,487,048  12/1995  McClure .................................. 365/207

Primary Examiner—Terrell W. Fears
Attorney, Agent, or Firm—Blakely, Sokoloff, Taylor & Zafman

[57] ABSTRACT

A pseudo-differential sense amplifier for sensing the state of an array memory cell by reference to a reference cell in a predetermined state. The sense amplifier has an input stage coupled to the array memory cell, which provides signals to a differential stage from which an output is generated. The input stage has reference and array side cascode circuits in which the components are matched on each side so as to eliminate process, temperature, and other extraneous variations from influencing the differential output. An enabling signal to the array side of the input stage is delayed with respect to the reference side such that voltage fluctuations externally introduced into the signals passed from the input stage to the differential stage do not cause erroneous switching and/or glitches to appear at the sense amplifier output. Additionally, parallel cascode and load transistors can be selectively switched into the input stage circuit to enable selectable cascode transconductance and circuit loading to effect selectable speed and/or input stage voltage swing.

33 Claims, 7 Drawing Sheets

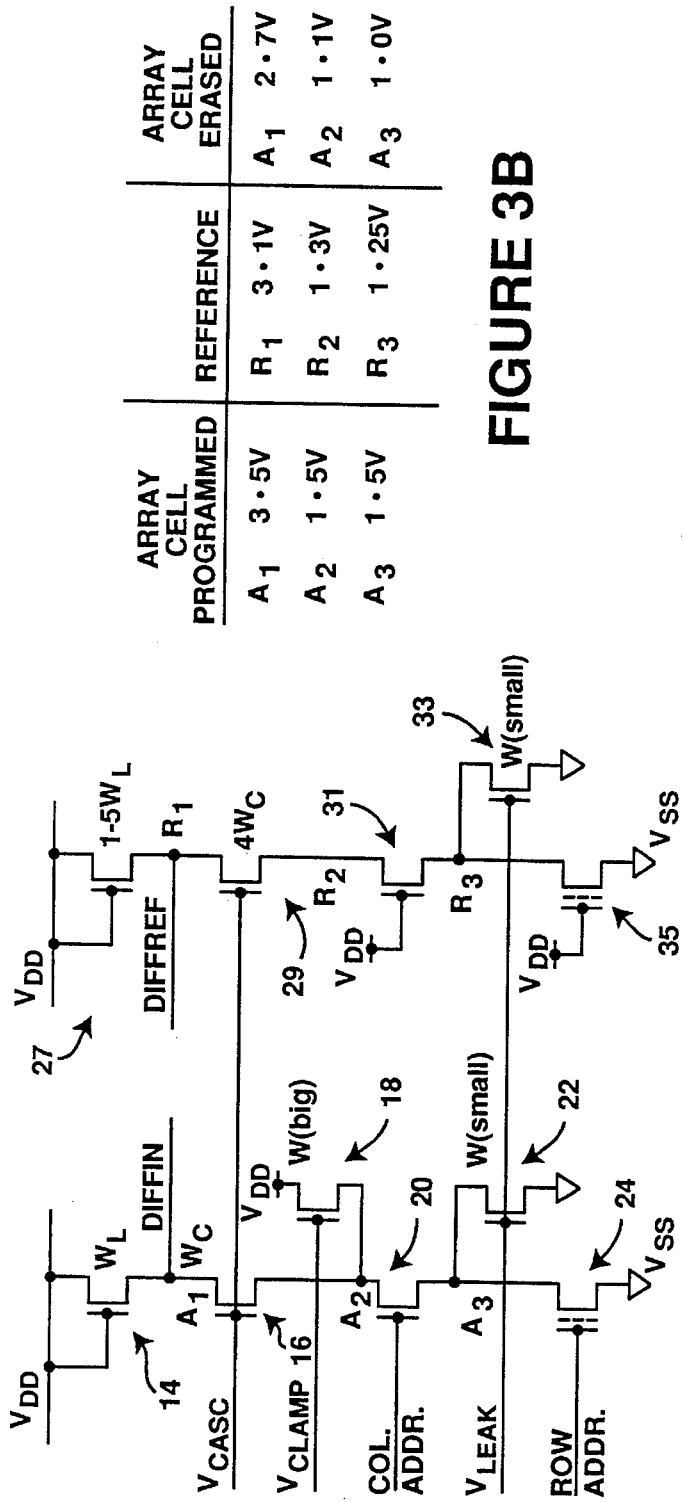
FIGURE 3A
FIGURE 3B
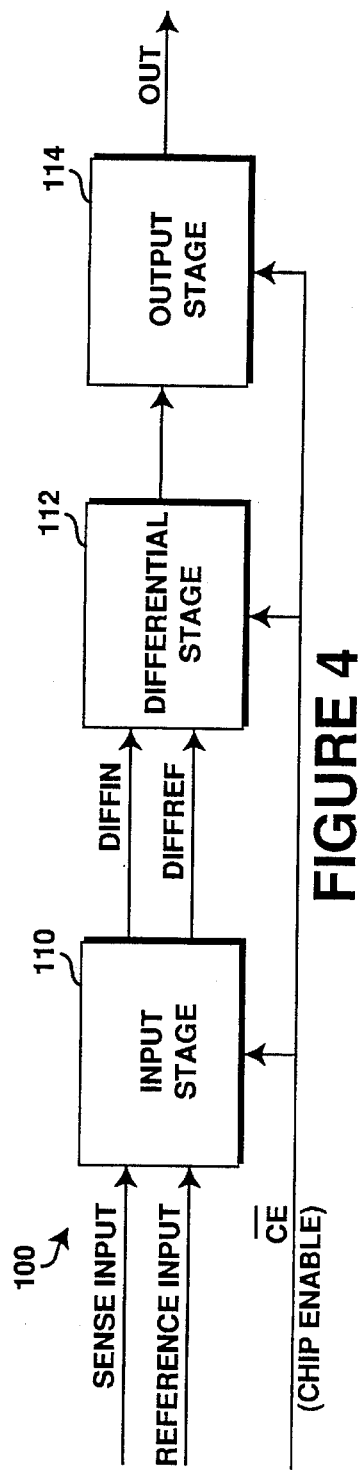
FIGURE 4

PSEUDO-DIFFERENTIAL SENSE AMPLIFIER

FIELD OF THE INVENTION

This invention relates to a sense amplifier and, more particularly, a pseudo-differential sense amplifier suitable for use in conjunction with memory circuits.

BACKGROUND OF THE INVENTION

In memory circuits, the individual memory cells are commonly organized into an array of rows and columns. The columns of memory cells in the array are associated with respective bitlines which act as an input/output ports for the cells in the respective columns. The rows of the array are associated with respective wordlines which are used to select a row of cells in the array. During a typical memory access, the appropriate wordline for a particular row of memory cells is selected, and the bitline corresponding to a column of the array containing a specific memory cell is used to access that cell. The bitline is connected to a sense amplifier which is constructed to sense the state of the selected memory cell and provide an amplified signal representing the sensed logic state to the next stage in the memory circuit.

In a static RAM circuit the memory cells commonly provide complementary outputs, and consequently complementary bitlines are usually available as input to a sense amplifier. For these applications a differential sense amplifier can conveniently be employed to sense the difference in signal levels on the complementary bitlines in order to determine the logic state of a memory cell. However, other forms of memory circuit, such as a floating-gate EPROM circuit, ordinarily provide only a single output is provided from each cell, i.e. only a single bitline for each array column. This arrangement is more space efficient, but makes sensing the cell state more difficult since a differential signal is not available. One way in which a sense amplifier for a memory array of this type can be operate is as a 'pseudo-differential' amplifier circuit, wherein one differential input senses the state of the array memory cell and the other differential input is coupled to a dummy memory cell in a predetermined state. Thus, in a pseudo-differential sense amplifier, the input received by the amplifier is a difference signal representing the state of the array cell being sensed as compared to the predetermined state of the dummy cell.

One prior art pseudo-differential sense amplifier circuit 5 is diagramatically represented in FIG. 2. The prior art sense amplifier 5 comprises an input stage 10, a differential stage 40, and an output stage 60. The input stage 10 comprises a pair of cascode circuits, namely an array side cascode circuit 12 and a reference side cascode circuit 25. The array side cascode circuit 12 is coupled by an array bitline to an array memory cell 24, whilst the reference side cascode circuit is coupled by a dummy bitline to a dummy memory cell 35. The input stage 10 provides differential inputs DIFFIN and DIFFREF to the differential stage 40, which in turn produces an amplified differential output to the output stage 60. The output stage 60 converts the differential signal from the differential stage to a logic level signal OUT, to be passed, for example, to an output buffer of the memory circuit containing the sense amplifier 5.

The prior art sense amplifier circuit 5 is designed such that the input stage reference side output voltage DIFFREF is between the array side output voltage DIFFIN for the array cell in the programmed state and the array cell in the erased state. This approach allows the circuit 5 to determine the state of the array cell based on whether the array side voltage DIFFIN is above or below the reference side voltage DIFFREF. In order to achieve this result the circuit 5 is constructed so as to carefully balance the voltages on the array and reference sides of the input stage 10 in order to meet the required voltage conditions for input to the differential stage 40. One consequence of this construction is that the cascode devices 16,29 on the array and reference sides of the input circuit must be different sizes. The different sized cascode devices introduces difficulties in operation of the sense amplifier under certain conditions, and can make the circuit susceptible to significant operational variations with variations in temperature, supply voltage and manufacturing process parameters. Another disadvantage of the prior art sense amplifier circuit 5 relates to glitches which can occur during power-on of the circuit.

Accordingly, it is an object of the present invention to at least substantially ameliorate some of the disadvantageous aspects of the prior art sense amplifier circuit. More particularly, it is an object of the invention to provide a pseudo-differential sense amplifier circuit which is less susceptible to erroneous switching and output glitches during activation of the sense amplifier. It is also an object of the invention to provide a pseudo-differential sense amplifier which is less susceptible to variations in process and operating conditions than the prior art.

SUMMARY OF THE INVENTION

In accordance with the present invention, there is provided a sense amplifier for sensing a binary state of a memory device. The sense amplifier comprises an input stage including first and second cascode circuits. The first cascode circuit comprises a first load device and a first cascode device coupled in series with a memory cell storage device to be sensed. The second cascode circuit comprises a second load device and a second cascode device coupled in series with a memory cell reference device, the memory cell reference device having substantially the same construction as the memory cell storage device but in a predetermined logic state. The first and second cascode circuits are coupled to first and second clamping circuits, respectively, such that the first and second clamping circuits clamp a node of the respective first and second cascode circuits to one of a first voltage and a second voltage according to an enable input signal. The sense amplifier also includes a differential stage comprising a differential amplifier circuit having first and second differential inputs coupled to receive signals from the first and second cascode circuits, respectively, and an output stage coupled to the differential stage to receive an output signal therefrom and for generating a logic level output signal in accordance with the signal received from the differential stage.

In another aspect, the invention provides a sense amplifier for sensing a binary state of a memory device, comprising a differential amplifier circuit having first and second inputs and a single-ended output, and an output circuit coupled to the differential amplifier circuit for converting a signal on the single-ended output to a logic level voltage output signal. A reference input circuit coupled to the first input of the differential amplifier circuit is provided, comprising a first cascode circuit coupled to a memory cell reference device, and a first clamping circuit for clamping a node of the first cascode circuit to one of a first voltage and a second voltage according to an enable signal input. A sense input circuit is provided, coupled to the second input of the differential amplifier circuit, the sense input circuit comprising a second cascode circuit coupled to a memory cell storage device to be sensed, and a second clamping circuit for clamping a node of the second cascode circuit to one of a first voltage and a second voltage according to the enable signal input. The sense amplifier also includes a delay circuit for delaying input of the enable signal to the second clamping circuit with respect to the first clamping circuit.

According to the invention there is also provided a CMOS sense amplifier for sensing a binary state of a memory cell storage device coupled to an array bitline in an array of memory cells of a memory circuit, the sense amplifier comprising: an array cascode circuit comprising a first load device coupled from a first voltage source (e.g. a voltage supply) to a differential input node, and an array cascode transistor coupled from the differential input node to the memory cell storage device by way of the array bitline; a reference cascode circuit comprising a second load device coupled from the first voltage source to a differential reference node, and a reference cascode transistor coupled from the reference differential node to a reference memory cell device in a predetermined binary state by way of a reference bitline; a reference bitline clamping circuit having an input coupled to receive an enable signal, and coupled to clamp the reference bitline to a clamp voltage according to the enable signal at the input; an array bitline clamping circuit having an input coupled to receive a delayed enable signal, corresponding to the enable signal and delayed with respect thereto, and coupled to clamp the array bitline to the clamp voltage according to the delayed enable signal; a differential amplifier circuit comprising a current source circuit, a third load device coupled between the first voltage source and a differential output node, an array differential transistor coupled between the third load device and the current source circuit and having a control node coupled to the differential input node, and a fourth load device and reference differential transistor coupled in series between the first voltage source and the current source circuit, the reference differential transistor having a control node coupled to the reference differential node; and an output circuit comprising a p-type pull-up transistor coupled between the first voltage supply and a sense output node and having a control node coupled to the differential output node, and a pull-down circuit coupled between the sense output node and a second voltage supply (e.g. ground) and being controlled from the differential output node.

In accordance with the present invention, there is further provided a memory circuit comprising an array of memory cell storage devices, an array bitline coupled to a memory cell storage device in the array, a reference cell device coupled to a reference bitline, and a sense amplifier having an array input coupled to the array bitline, a reference input coupled to the reference bitline, and a sense amplifier output. The sense amplifier includes first and second cascode transistors, the first cascode transistor being coupled from a first load device to the array input and the second cascode transistor being coupled from a second load device to the reference input. The sense amplifier also includes first and second clamping circuits, the second clamping circuit being coupled to the reference bitline for clamping the reference bitline to a clamping voltage on receipt of a first enable signal, and the first clamping circuit being coupled to the array bitline for clamping the array bitline to the clamping voltage on receipt of a second enable signal delayed with respect to the first enable signal. A differential amplifier circuit having first and second inputs and a single-ended output is included in the sense amplifier, the first input being coupled to the junction of the first load device and the first cascode transistor, and the second input being coupled to the junction of the second load device and the second cascode transistor. The sense amplifier output is provided by an output circuit comprising a pull-up circuit and a pull-down circuit having respective inputs coupled to the differential amplifier single-ended output.

In one form of the invention, each clamping circuit includes a bitline discharge transistor having one conduction node coupled to a first voltage supply, such as ground, and the other conduction node coupled to the respective bitline. The discharge transistor allows the bitline to discharge to ground when the sense amplifier circuit is not enabled. The clamping circuit also includes a clamping transistor having one conduction node coupled to the bitline, and the other conduction node coupled to a second voltage supply by way of a clamp enabling transistor. The clamping transistor has its control node coupled controlled to a predetermined clamping voltage source, and the clamp enabling transistor is coupled so as to be controlled by an enable signal. The enable signal is effective to turn off the discharge transistor and to turn on the clamp enable transistor so that the voltage on the respective bitline rises from the first voltage supply level to a clamp voltage determined by the clamping voltage source. The enable signal coupled to control the clamping circuit connected to the array bitline is delayed with respect to the reference bitline enable signal. Preferably the delayed enable signal is generated by passing the enable signal through a series of inverter elements.

By having the array bitline clamp enable delayed with respect to the reference bitline clamp enable, the array cascode circuit is able to withstand greater fluctuations, and greater noise immunity is achieved, without resulting in erroneous switching of the output of the sense amplifier. This is because, with the combination of discharge and clamping transistors described above, the reference input to the differential amplifier rises from a fixed voltage, followed separately by the array input to the differential amplifier.

It is preferred that the cascode transistors on the reference and array sides of the input circuit for the sense amplifier be matched in their characteristics. In one form of the invention the reference side cascode circuit has a load which is about half of the load on the array side cascode circuit. The array side cascode circuit is provided with a leaker transistor to provide bias current through the array side load and cascode transistor, and the reference side cascode circuit is provided with a matching leaker transistor as well as an additional leaker transistor coupled between the reference side load and cascode transistor in order to draw additional current through the reference side load to match the voltage across the array side load, due to the difference in load sizes.

In another aspect of the invention, a mechanism is provided with which to alter the response speed of the sense amplifier circuit, by altering the size of the load and cascode transistor transconductance on both the array and reference sides of the input circuit. In one embodiment, parallel cascode transistors are provided in each of the reference and array cascode circuits, with the parallel cascode transistors being controlled by separate voltages. Thus, by providing a control voltage to both cascode transistors on each side a larger transconductance, and hence higher speed, can be achieved as compared to only a single cascode transistor on each side. Parallel load devices may also be provided which can be switched into the cascode circuits to decrease load resistance and increase speed. If, however, a greater voltage swing at the input to the differential stage is desired, the load can be increased.

The invention further provides a sense amplifier having an array input coupled to a memory cell storage device, a reference input coupled to a reference memory cell, and a sense amplifier output, the sense amplifier comprising: matching first and second cascode transistors, the first cascode transistor being coupled from a first load device to the array input and the second cascode transistor being coupled from a second load device to the reference input, the first and second cascode transistors being controlled by a first cascode voltage input; matching third and fourth cascode transistors, the third and fourth cascode transistors being coupled in parallel with the first and second cascode transistors, respectively, and the third and fourth cascode transistors being controlled by a second cascode voltage input; a differential amplifier circuit having first and second inputs and a single-ended output, the first input being coupled to the junction of the first load device and the first cascode transistor, and the second input being coupled to the junction of the second load device and the second cascode transistor; and an output circuit providing the sense amplifier output and comprising a pull-up circuit and a pull-down circuit having respective inputs coupled to the differential amplifier single-ended output.

In this specification, where "conduction terminals" of a transistor are referred to this is to be taken as a reference to source/drain terminals or collector/emitter terminals, as opposed to gate or base terminals or nodes which are sometimes referred to as a "control node" or "control terminal". It is to be recognized that particularly in MOS type integrated circuit transistors, the fabricated devices are oftentimes symmetrical, which allows the terms source and drain to sometimes be employed interchangeably depending upon the relative potentials applied thereto.

BRIEF DESCRIPTION OF THE DRAWINGS

The objects, features and advantages of the present invention will become apparent to one skilled in the art from reading the following detailed description in which:

FIG. 3A is a schematic diagram of an input stage of the prior art sense amplifier circuit of FIG. 2;

FIG. 3B is a table of typical node voltages in operation of the input stage of FIG. 3A;

FIG. 4 is a block diagram of a sense amplifier according to an embodiment of the present invention;

DETAILED DESCRIPTION OF THE INVENTION

The invention is described in greater detail hereinafter, by way of example only, with reference to a preferred embodiment thereof. In the following description, numerous specific details are set forth such as examples of voltages and particular transistor configurations, etc. in order to provide a thorough understanding of the present invention. It will be evident, however, to those skilled in the art that such specific details are not necessarily required in order to practice the invention. In other instances, well known structures and circuit not relating to the crux of the invention have been omitted or simplified in order to avoid unnecessarily obscuring the invention.

Figure 1:
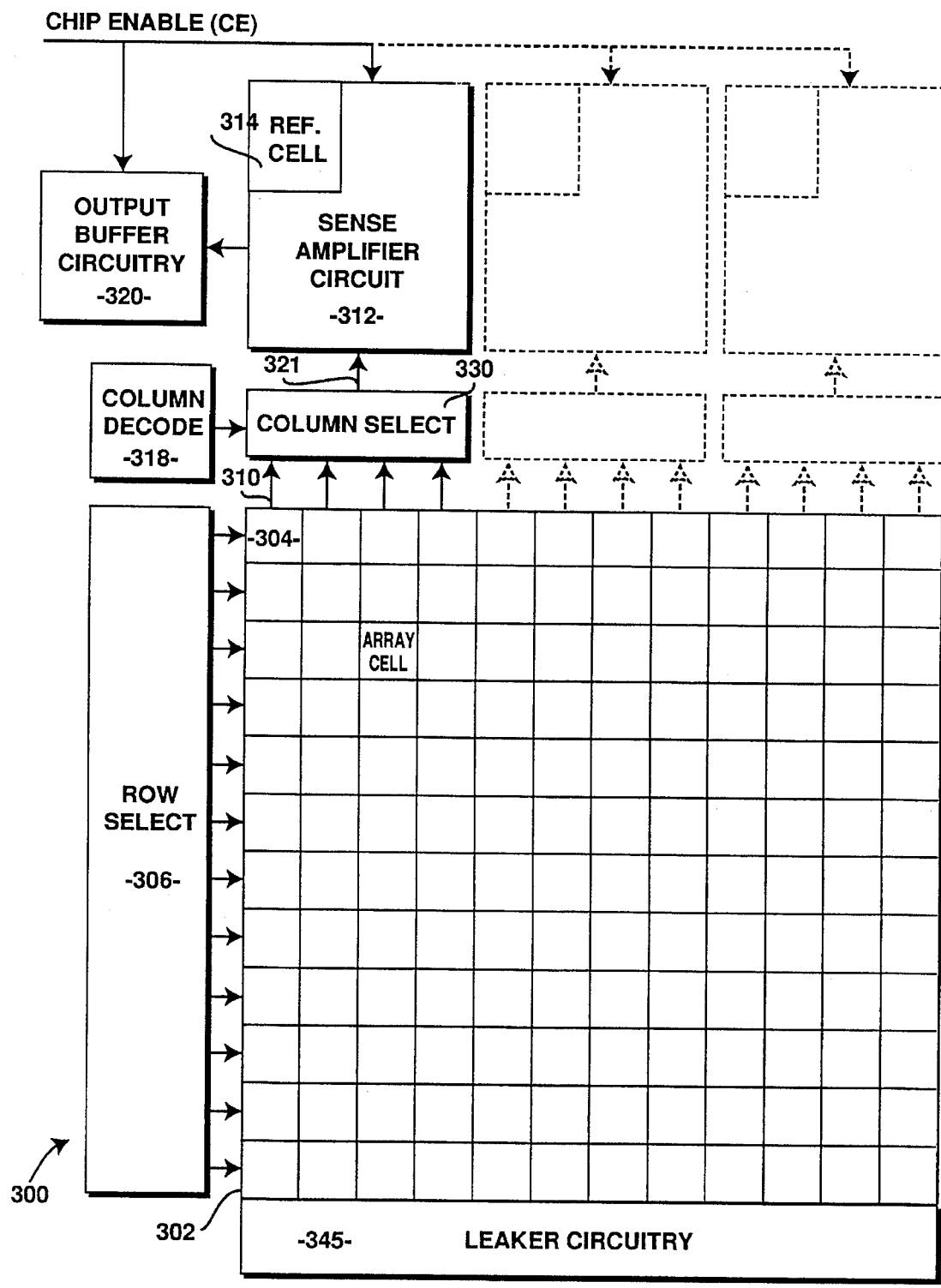
FIG. 1 is a simplified block diagram of a memory circuit illustrating a pseudo-differential sense amplifier circuit.

Referring firstly to FIG. 1, there is shown a block diagram of a memory circuit 300. The memory circuit 300 comprises an array 302 of memory cells 304 for storing digital data. Each memory cell 304 may comprise, for example, an SRAM cell, an EPROM cell or a flash memory cell, which is able to be programmed into a particular binary state representing a bit of stored data. In order to access the data stored in the memory cells 304, a sense amplifier circuit 312 is provided to sense the binary state of a particular memory cell 304 and output a corresponding logic level signal to an output buffer circuit 320.

The memory cells 304 in the array 302 are typically arranged in rows and columns of cells, with a separate sense amplifier circuit 312 provided for a group of columns of memory cells in the array. Each column of cells is coupled to provide output on a common bitline 310 which is utilized as an input to a column select circuit 330. The column select circuit 330 couples one of the bitlines 310 to the sense amplifier 312 by way of a sense amplifier input 321, according to signals from a column decode circuit 318. Each row of memory cells is coupled to row select circuitry 306 by way of a respective wordline 308, such that a signal asserted on a particular wordline 308 by the row select circuit 306 courses the memory cells 304 in the corresponding row to couple their outputs onto the respective bitlines. A particular cell is selected from the selected row of memory cells using the column decode and select circuitry 318, 330 which couples the sense amplifier input 321 to the bitline 310 of the column in which the particular cell is located. A chip enable (CE) signal is provided to the sense amplifier circuit 312 to enable the sense amplifier to sense the state of the selected memory cell and output the corresponding logic level signal to the output buffer circuit 320.

The array of memory cells represented in FIG. 1 provide only a single bitline for each row of memory cells. Accordingly, a reference cell 314, which is in a predetermined binary state, is also coupled for input to the sense amplifier circuit 312, by way of a reference bitline (not shown). The input signal provided by the reference cell 314 provides the sense amplifier 312 with a signal with which to compare the output of the array memory cell, so as to determine the binary state of the array memory cell being sensed. Leaker circuitry 345 is also provided, coupled to the bitlines 310 of the columns of memory cells, and is described in greater detail herein below.

Figure 2:
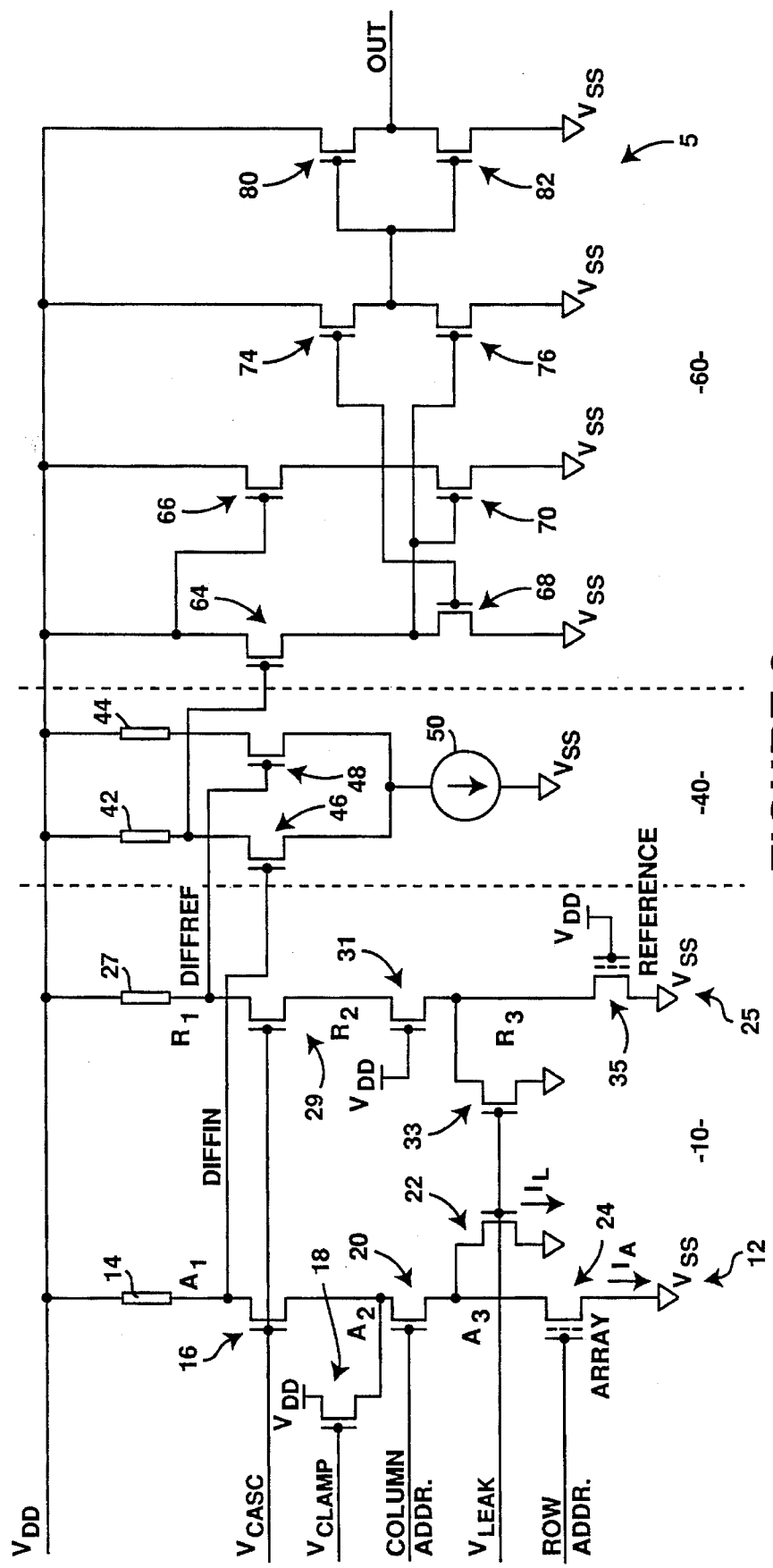
FIG. 2 is a schematic diagram of a prior art sense amplifier circuit.

FIG. 2 is a schematic diagram of a prior art pseudo-differential sense amplifier circuit 5, constructed in CMOS technology. The prior art sense amplifier 5 comprises an input stage 10, a differential stage 40, and an output stage 60. The input stage 10 interfaces to a memory cell storage device 24 from an array of memory cells on one side of the input stage circuit (the array side), and to a memory cell reference device 35 on the other side of the input stage circuit (the reference side). The memory cell storage device 24 and memory cell reference device 35 shown in the circuit of FIG. 2 are, in this instance, floating gate memory devices, as may be found in an EPROM memory circuit. The memory cell storage device 24 is coupled in an array side cascode circuit 12, whilst the memory cell reference device 35 is coupled in a reference side cascode circuit 25. The array side cascode circuit 12 comprises a load device 14, which is coupled from a first voltage source $V_{DD}$ (e.g. 5 volts) to a node $A_1$, which provides an input DIFFIN for the differential stage circuit 40. An array side in type cascode transistor 16 has its drain node coupled to the node $A_1$, and its source node coupled to a node $A_2$. The array cascode transistor 16 is provided with a controlling voltage $V_{CASC}$ at the gate node thereof. The voltage at node $A_2$ is controlled by a clamping transistor 18 coupled from the voltage supply $V_{DD}$ to the node $A_2$, and having a supplied gate voltage $V_{CLAMP}$. The node $A_2$ is then coupled to the drain of the memory cell storage device 24 at a node $A_3$ by way of a column address decoding transistor 20. The column address decoding transistor 20 is coupled to receive a column address select logic signal at its gate node. The memory cell storage device 24 has its source coupled to a second supply voltage $V_{SS}$ (e.g. ground), and receives at its gate terminal a row address select signal. Referring again to FIG. 1, the gate node of the memory cell storage device 24 corresponds to the wordline 308 in FIG. 1, whilst the drain node (node $A_3$) corresponds to the bitline 310 in FIG. 1. An array side leaker transistor 22 couples the node $A_3$ to supply voltage $V_{SS}$, and is supplied with a gate control voltage $V_{LEAK}$.

The reference side cascode circuit 25 is constructed similarly to the array side cascode circuit 12. A reference side load device 27 is coupled from supply voltage $V_{DD}$ to a node $R_1$, which provides an input DIFFREF t to the differential stage circuit 40. A cascode transistor 29, which receives the voltage signal $V_{CASC}$ at the gate thereof, couples the node $R_1$ to a node $R_2$. A dummy column address select transistor 31, having its gate coupled to supply voltage $V_{DD}$, couples the node $R_2$ to a node $R_3$ at the drain of memory cell reference device 35. The memory cell reference device 35 is coupled to the supply voltage $V_{SS}$ at its source node, and has its gate node coupled to supply voltage $V_{DD}$. A reference leaker transistor 33 also couples the node $R_3$ to supply voltage $V_{SS}$, and its controlled by voltage signal $V_{LEAK}$.

The differential stage circuit 40 of the prior art sense amplifier 5 comprises the transistors 46, 48 couples at their drain nodes to supply voltage $V_{DD}$ by way of respective load devices 42, 44. The source nodes of transistors 46, 48 are coupled to a current source 50, so as to form a differential amplifier circuit. The gate node of transistor 46 receives signal DIFFIN from the array side cascode circuit 12, whilst the gate of transistor 48 receives signal DIFFREF from reference side cascode circuit 25.

The differential stage circuit 40 provides differential outputs at the drain nodes of transistors 46, 48 which are coupled to the gates of transistors 64, 66 of the output stage 60. The transistors 64, 66 control cross-coupled transistors 68, 70, which are coupled to series transistors 74, 76. The output stage transistors 64, 66, 68, 70 and 74, 76 act to transform the differential output from the differential stage 40 to a single ended output which is fed to an inverter stage comprising transistors 80, 82.

The operation of the prior art sense amplifier circuit 5 is as follows. The sense amplifier and memory storage device 24 to be sensed are addressed by asserting high logic signals on the row address input (the wordline) to memory cell storage device 24, and the column address input to column decoding transistor 20. With the gate of memory cell storage device 24 activated by the wordline, the transconductance of this device is determined by the programmed state of the floating gate thereof. If the device is in the erased (binary zero) state, the current IA conducted by the device 24 will be greater than if the device 24 is in the programmed (logic 1) state. The dummy column decode transistor 31, and the memory cell reference device 35, in the reference side cascode circuit 25 are held in an activated state by their gate connections to voltage supply $V_{DD}$. Leaker transistors 22, 33 conduct respective leaker currents $I_L$ from the array side cascode circuit 12 and reference side cascode circuit 25, and controlled by the voltage $V_{LEAK}$ which is set to a predetermined level according to the required leaker current. The clamping transistor 18 coupled to node $A_2$ on the array side cascode circuit 12 clamps the voltage at node $A_2$ to a predetermined level according to the voltage set by $V_{CLAMP}$ at the gate of clamping transistor gate 18. Respective cascode transistors 16, 29 are controlled by the voltage set at the gate nodes thereof by $V_{CASC}$ the biasing voltages $V_{CASC}$, $V_{CLAMP}$, and $V_{LEAK}$, and the device sizes of cascode transistors 16, 29, leaker transistors 22, 33 and clamping transistor 18 are selected so as to provide appropriate voltage levels at the nodes $A_1$, $A_2$, $A_3$ and $R_1$, $R_2$, $R_3$ respectively.

Referring to FIG. 3A, the input stage circuit for the prior art sense amplifier of FIG. 2 is shown in greater detail. FIG. 3B is a table of voltage levels for the nodes $R_1$, $R_2$, $R_3$ in the reference side cascode circuit, and nodes $A_1$, $A_2$, $A_3$ in the array side cascode circuit for the memory cell storage device 24 in the programmed state and in the erased state. The input voltage levels and device sizes for the input stage circuit are designed such that the voltage levels at nodes $R_1$, $R_2$ and $R_3$ lie between the voltage levels at respective nodes $A_1$, $A_2$, and $A_3$ for the memory cell storage device 24 in the programmed state and in the erased state. This is achieved by, in one aspect, creating the reference side cascode transistor 29 with a larger width-to-length ratio than the array side cascode transistor 16. In this instance, the width-to-length ratio for the reference side cascode transistor 29 is constructed so as to be four times larger ($4W_C$) than the width-to-length ratio $W_C$ of the array side cascode transistor 16. Additionally, the load 27 for the reference side cascode circuit is constructed so as to be somewhat smaller than the load 14 for the array side cascode circuit, In FIG. 3A, the load devices 14, 27 are constructed from NMOS transistors having both drain and gate nodes coupled to the voltage supply $V_{DD}$, and source nodes coupled to the nodes $A_1$, $R_1$ respectively. The reference side load 27 is constructed with a width to length ratio which is one and a half times larger than the width to length ratio of the array side load 14, such that the reference side load presents a relatively smaller resistance as compared to the array side load. Additionally, in order to meet the voltage requirements for the input stage circuit, the voltage at node $A_2$ cannot be clamped too strongly by the clamping transistor 18, requiring that the voltage $V_{CLAMP}$, be relatively small.

A number of disadvantageous effects have been found to arise from the structure of the prior art sense amplifier circuit. For example, the prior art sense amplifier can be susceptible to process and operating condition variations so as to effect the performance and functionality of the sense amplifier circuit. Because of the required sizing of the cascode transistors (16, 29), the cascode loads (14, 27), and clamping voltage ($V_{CLAMP}$), the bias currents differ as between the array side and reference side of the circuit. The unmatched devices and biased currents can therefore cause transition speed skewing and noise margin variation with temperature, supply voltage and process variations. Centering of the reference node voltages, as discussed in relation to FIG. 3B, depends on the ratio of the reference load, cascode transistor size and reference cell. Additionally, the nodes $A_2$ and $R_2$ may not fully discharge to ground and can cause a glitch at the output of the sense amplifier during a power on transition. Finally, the body effect present in the NMOS diode loads utilized in the input stage circuit make the circuit design difficult to model so as to determine the appropriate design conditions prior to fabrication.

Referring to FIG. 4, there is shown a block diagram of a pseudo-differential sense amplifier 100 in accordance with an embodiment of the present invention. The overall structure of the sense amplifier 100 is similar to that of the prior art sense amplifier shown in FIG. 2, comprising an input stage 110, a differential stage 112 and an output stage 114. The sense amplifier 100 includes mechanisms for ensuring robust operation in spite of possible temperature, supply voltage and/or process variations, as well as power on conditions at a transition of the chip enable signal (CE). Also, the differential stage 112 of the sense amplifier 100 requires only a single-ended output to the output stage 114, in contrast with the differential and output stages 40, 60 of the prior art sense amplifier. These features, together with additional features of the pseudo-differential sense amplifier of the present invention are described in greater detail herein below, with reference to FIGS. 5, 6 and 7, and 8. The embodiment of the invention illustrated in FIGS. 5, 6 and 7 comprise CMOS technology circuits. The supply voltages $V_{DD}$ and $V_{SS}$ utilized by the circuits in the described implementation correspond to 5 volts and 0 volts (ground), respectively.

Figure 5:
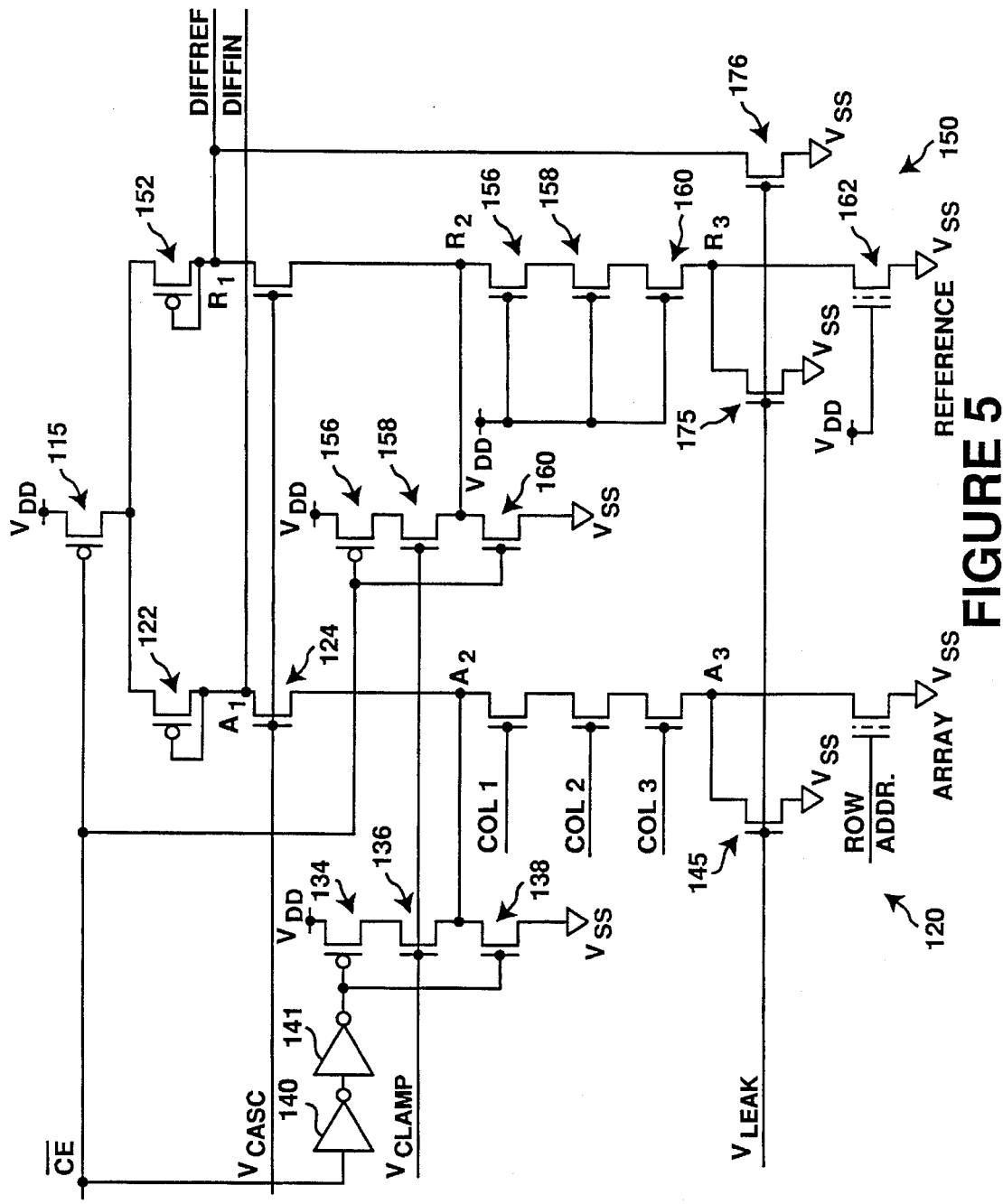
FIG. 5 is a schematic diagram of an input stage of a sense amplifier according to an embodiment of the invention.

Referring firstly to FIG. 5, there is shown an embodiment of the input stage 110, comprising an array side cascode circuit 120 and a reference side cascode circuit 150. The array side cascode circuit 120 is coupled to a memory cell storage device 132, in this case a floating gate storage device having its source node coupled to supply voltage $V_{SS}$ (for example, ground), and its gate node coupled to a wordline of a memory array so as to receive a row address select signal. The drain of the memory cell storage device 132 is coupled to a bitline node $A_3$, to which is also coupled a leaker transistor 145. The leaker transistor 145 is a weak N type device coupled from the node $A_3$ to the supply voltage $V_{SS}$, and receives a controlling gate voltage $V_{LEAK}$. A series of n-type column select transistors 126, 128, 130 couple the node $A_3$ to a node $A_2$. The column select transistors 126, 128, 130 receive column select signals $COL_1$, $COL_2$, and $COL_3$, respectively, and form a portion of the column select circuitry for the sense amplifier.

An array side n-type cascode transistor 124 is provided with its source coupled to the node $A_2$ and drain coupled to a node $A_1$ which forms an output DIFFIN for the input stage 110. The gate of array side cascode transistor 124 is provided with a fixed voltage $V_{CASC}$. An array side load 122 comprises a p-type transistor having its gate and drain coupled to the node $A_1$, and source coupled to supply voltage $V_{DD}$ by way of a p-type enabling transistor 115. The enabling transistor 115 is controlled by a chip enable signal (active low) which is coupled to the gate thereof in order to turn on the P type enabling transistor 115 when the chip enable signal is in a low logic state. Thus, when the chip enable signal is low (active), the enabling transistor 115 conducts to allow current to be supplied from the supply voltage $V_{DD}$ to the cascode circuits 120, 150.

The reference side cascode circuit 150 of the input stage 110 is constructed so as to substantially match the array side cascode circuit 120. The memory cell reference device 162 has the same characteristics as the memory cell storage device 132, although the reference device 162 remains permanently in the erased (logic 0) state. The gate node of the memory cell reference device 162 is tied to the supply voltage $V_{DD}$, so the reference device is also permanently enabled. The reference side cascode circuit 150 also includes a series of three n-type transistors 156, 158 and 160 constructed to physically match the column select transistors 126, 128 and 130 in the array side cascode circuit. The gates of transistors 156, 158, 170 are also tied to supply voltage $V_{DD}$, and so are held in the conducting state. The reference side cascode transistor 154 is constructed to physically match the characteristics of the array side cascode transistor 124. For example, in the preferred embodiment of the invention both cascode transistors are constructed with the same channel width, channel length, layout, and orientation. Both cascode transistors 124, 154 are also driven by the same date voltage, $V_{CASC}$. A reference side load device 152 is coupled from the drain of reference side cascode transistor 154 to supply voltage $V_{DD}$ by way of the enabling transistor 115. The reference side load device comprises a p-type transistor having its gate coupled to its drain node so as to form a diode load. The node $R_1$ formed between the load device 152 and cascode transistor 154 in the reference side cascode circuit constitutes an output DIFFREF to the differential stage circuit of the sense amplifier, which is described herein below.

The PMOS load transistor 152 on the reference side of the input stage circuit 110 is constructed so as to have twice the width to length ratio of the array side PMOS load transistor 122, such that the loading effect on the reference side is one half of the loading effect on the array side. With the other components in the array and reference side cascode circuits matched, the difference in loads enables centering of the reference side output voltage DIFFREF between the values of DIFFIN for the memory cell storage device 132 in the programmed and erased states. In order to ensure that the array and reference side cascode circuits 120, 150 respond only to the difference in states as between the reference and array cells, the reference side cascode circuit 150 is provided with two n-type leaker transistors 175 and 176. The leaker transistor 175 is coupled from a node $R_3$ formed between the memory cell reference device 162 and dummy select transistor 160, and is controlled by the same voltage $V_{LEAK}$ as the corresponding leaker transistor 145 coupled to node $A_3$ of the array side cascode circuit. The second leaker transistor 176 in the reference side cascode circuit is coupled from node $R_1$ to the supply voltage $V_{SS}$ (ground), and is also controlled by $V_{LEAK}$. Thus, even though the loading effect of load device 152 on the reference side is only half that of loading device 122 on the array side, twice the leaker current is drawn therethrough so as to present substantially the same bias voltage drop across the loads on each side of the circuit due to leaker current. This allows the input stage circuit 110 to be free from variations in leaker current as between the reference and array sides of the circuit.

Clamping circuits are also provided on each side of the input stage circuit in order to regulate the voltage at nodes $A_2$, $R_2$ at the source of respective cascode transistors 124, 154. On the reference side cascode circuit, an n-type pulldown transistor 168 is coupled from the node $R_2$ to supply voltage $V_{SS}$ and is controlled by the active low chip enable signal. The pulldown transistor 168 is in the conducting state when the sense amplifier is inactive, i.e. the chip enable signal is in a logic high state. This causes the pulldown transistor 168 to discharge the node $R_2$ and bitline to ground (supply voltage $V_{SS}$).

A reference side n-type clamping transistor 166 is coupled from the node $R_2$ to supply voltage $V_{DD}$ by way of a reference side enabling transistor 164. The enabling transistor 164 is a P type device which is controlled by the active low chip enable signal so as to conduct when the sense amplifier circuit is active. The reference side clamping transistor 166 is coupled at its gate to a clamp control voltage $V_{CLAMP}$ which is set to enable the clamping transistor 166 to clamp the voltage at node $R_2$ to an appropriate level.

The array side cascode circuit 120 also includes an arrangement of an n-type pulldown transistor 138 and n-type clamping transistor 136 coupled to node $A_2$, and a p-type enabling transistor 134. The clamping transistor 136 receives the same clamping control voltage $V_{CLAMP}$. However, the gate of the pulldown transistor 138, and in particular the gate of enabling transistor 134, on the array side are controlled by a delayed version of the active low chip enable signal. This is achieved by passing the chip enable signal through delay elements comprising series inverters 140 and 141, and coupling the outputs of the delay elements to the control nodes of enabling transistor 134 and pulldown transistor 138. Since the input of the chip enable signal to the array side clamping circuit is delayed with respect to the chip enable signal received at the reference side clamping circuit, the output DIFFREF from the reference side of the input stage circuit 110 rises towards its quiescent value before the output DIFFIN from the array side of the circuit, upon activation of the sense amplifier by the chip enable signal. The effect of this is to give the sense amplifier a greater immunity to noise and supply voltage variations, as described below in connection with FIG. 8.

Figure 8A:
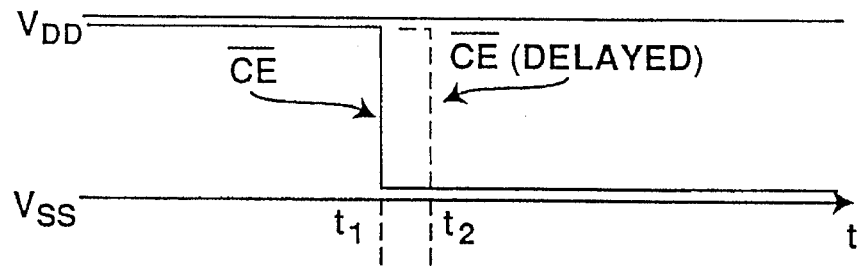
FIG. 8a), 8b), 8c) and 8d) are voltage transition diagrams illustrating examples of the transition of output signals from the sense amplifier input stage.
Figure 8B:
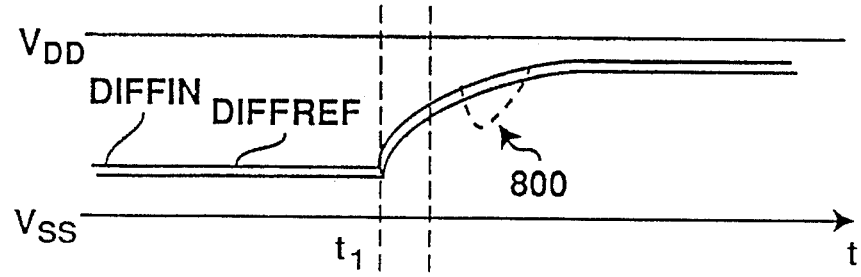

In FIG. 8a) there is shown a high to low transition of the active low chip enable signal CE at time $t_1$, which activates the sense amplifier circuit. FIG. 8b) illustrates the behavior of the voltage on the output lines DIFFREF and DIFFIN for a sense amplifier circuit in which ordinary clamping transistors (such as clamping transistor 18 in FIG. 2) is employed in the input stage circuit 110. As shown in FIG. 8b), before the transition of the chip enable signal the voltage at DIFFIN and DIFFREF are at an undefined floating voltage level. At the transition of the chip enable signal to the active low state, the input stage circuit 110 is activated by switching of the transistor 115 which couples the cascode circuits to supply voltage $V_{DD}$, DIFFIN and DIFFREF rise toward their quiescent voltage levels at the same time, beginning at transition time $t_1$. Because the inputs to the differential stage of the sense amplifier, DIFFIN and DIFFREF, rise from an undefined level at the same time upon activation of the sense amplifier circuit, the sense amplifier can be susceptible to erroneous switching at the output thereof due to noise fluctuations or the like. For example, a voltage fluctuation such as 800 shown in FIG. 8b) in a sense amplifier having an input stage with ordinary clamping circuits and without discharge transistors can cause a glitch due to erroneous switching to be produced at the output of the sense amplifier. For example, erroneous switching can be caused from address or chip enable transitions.

Figure 8C:
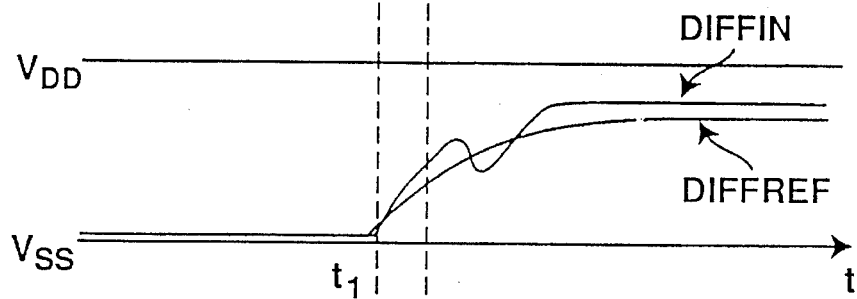

The benefit of the delay in passing the chip enable signal to the array side circuit can be ascertained by reference to FIGS. 8c) and 8d). FIG. 8c) illustrates the DIFFIN and DIFFREF signals from an input stage circuit employing discharge transistors but having both the array and reference sides of the circuit controlled from the same chip enable signal. As can be seen from the Figure, if a voltage fluctuation occurs in DIFFIN three transitions of the output from the differential stage may result: a first transition where DIFFIN initially rises above DIFFREF; a second transition during the voltage fluctuation where DIFFIN falls below DIFFREF; and a third transition where DIFFIN recovers to rise above DIFFREF to its correct level.

Figure 8D:
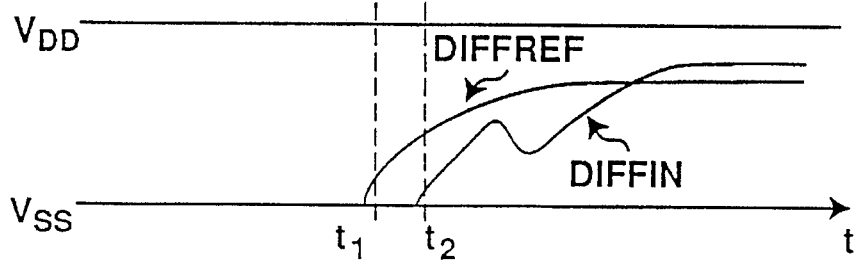

In contrast, FIG. 8d) illustrates the voltage levels of the DIFFIN and DIFFREF lines from the input stage circuit 110 according to the present invention. It will be noted that while the chip enable signal is in a high state (before time $t_1$) the pulldown transistors 138 and 168 cause the DIFFIN and DIFFREF voltage levels to remain at $V_{SS}$. Following the transition of the chip enable signal to a low state at time $t_1$, the pulldown transistor 168 on the reference side cascode circuit switches off and clamp enabling transistor 164 switches on, allowing the clamping transistor 166 to clamp node $R_2$. This causes DIFFREF to rise towards its quiescent level beginning at time $t_1$. However, the chip enable signal to the array side is delayed by series inverters 140, 141 by a time interval $t_d$, such that a delayed chip enable signal is received at the gate nodes of transistors 134 and 138 on the array side cascode circuit at a time $t_2$. At time $t_2$, the array side pulldown transistor 138 switches to a nonconducting state, and enabling transistor 134 switches on so as to allow DIFFIN to rise towards it quiescent level by the clamping action of clamping transistor 136 on node $A_2$. Since the DIFFIN and DIFFREF inputs to the differential stage of the sense amplifier are separated by delaying DIFFIN with respect to DIFFREF, noise fluctuations in DIFFIN will not cause erroneous transitions and undesirable glitches to appear at the output of the sense amplifier. As shown in the example in FIG. 8d), only a single transition will occur when DIFFIN rises above DIFFREF, in contrast to the multiple transitions in the example of FIG. 8c).

Figure 6:
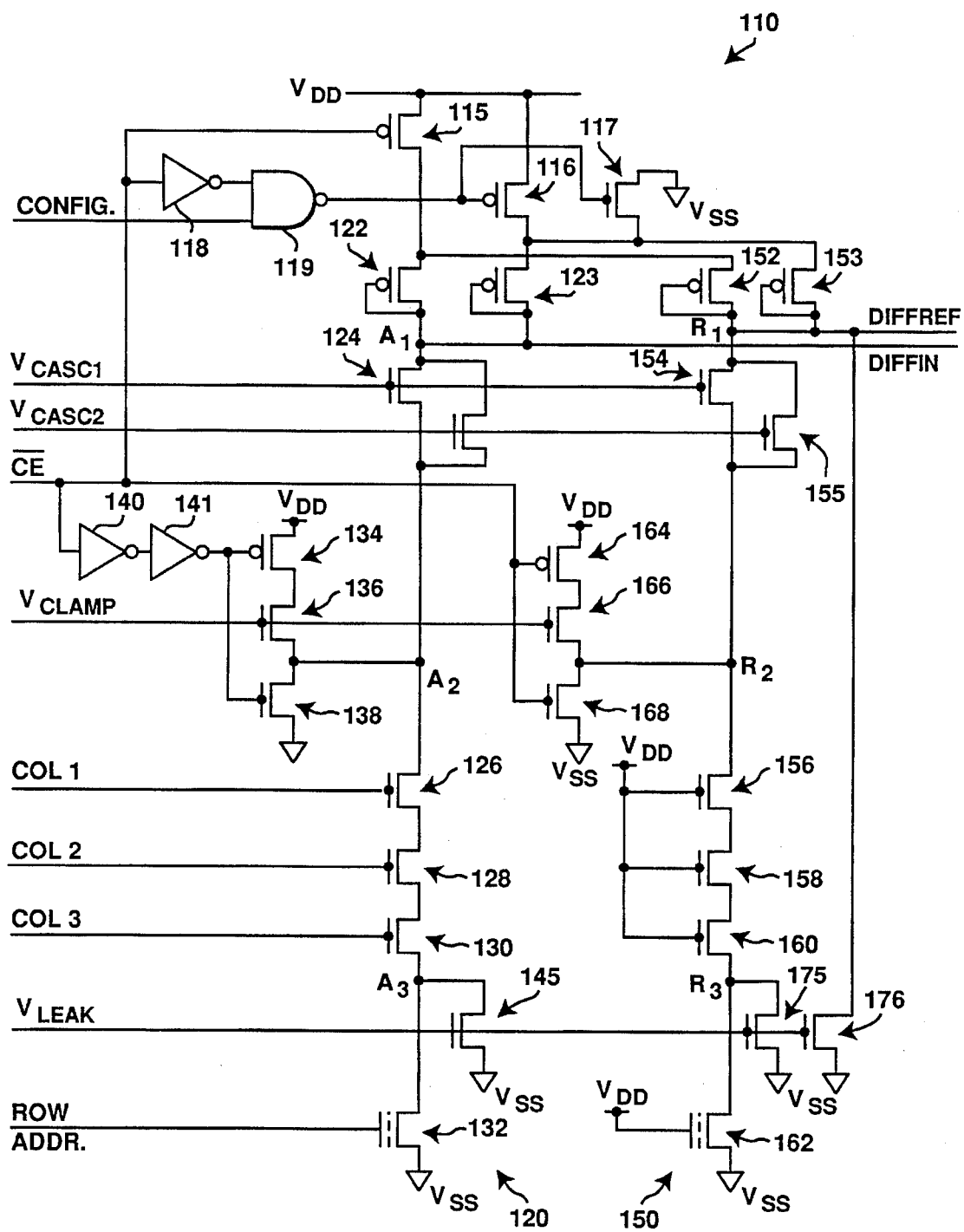
FIG. 6 is a schematic diagram of a sense amplifier input stage according to an embodiment of the invention, including features omitted from FIG. 5.

Some additional features of the sense amplifier of the present invention are shown in the input stage circuit 110 illustrated in FIG. 6. The input stage circuit of FIG. 6 is generally similar to the circuit shown in FIG. 5, with the addition to circuitry to enable the speed and voltage swing of the sense amplifier to be adjusted. Matched secondary cascode transistors 125 and 155 are included in the input stage circuit, coupled in parallel with array side cascode transistor 124 and reference side cascode transistor 154, respectively. The secondary cascode transistors 125, 155 are controlled by a second cascode control voltage $V_{CASC2}$. If the second cascode control voltage $V_{CASC2}$ is applied to the secondary cascode transistors 125, 155, the overall transconductance of the array and reference side cascode circuits is increased, which allows the input stage circuit, and thus the sense amplifier as a whole, to operate at higher transition speeds. Thus, by selectively applying the cascode control voltages $V_{CASC1}$ and $V_{CASC2}$ to the parallel cascode transistors, the operational speed of the input stage circuit 110 can be selected.

Similarly, additional PMOS diode load devices 123 and 153 are provided in parallel with load devices 122 and 152 on the array and reference side cascode circuits respectively. The additional load devices 123, 153 can be switched into the circuit in parallel with the existing load devices through the operation of p-type enabling transistor 116 which couples the additional load devices to supply voltage $V_{DD}$. The enabling transistor 116 is operable from the output of a NAND gate 119, which receives input from an inverted chip enable signal by way of inverter 118, and a configuration bit signal. An n-type pulldown transistor 117 is also coupled to the source nodes of the additional load devices 123, 153, and receives the output of the NAND gate 119. Thus, when the configuration bit signal is active (high) and the chip enable signal is also active (low), the NAND gate 119 causes enabling transistor 116 to conduct, placing additional load devices 123, 153 in parallel with load devices 122, 152 respectively. Otherwise, the pulldown transistor 117 is in the conducting state, isolating the additional load devices 123, 153 from operation in the input stage circuit 110.

With the parallel load devices 122, 123 and 152, 153 on the array and reference sides respectively, the load resistance on each side of the circuit is reduced, which also increases the operational speed of the sense amplifier circuit. It will be recognized, however, that by increasing the speed of the input stage circuit, the available voltage swing for the array and reference side cascode circuits is reduced, which may be disadvantageous in some applications. Therefore, the speed/voltage swing is selectable in the circuit shown in FIG. 6, through the use of the configuration bit signal and the cascode voltage control signals.

Figure 7:
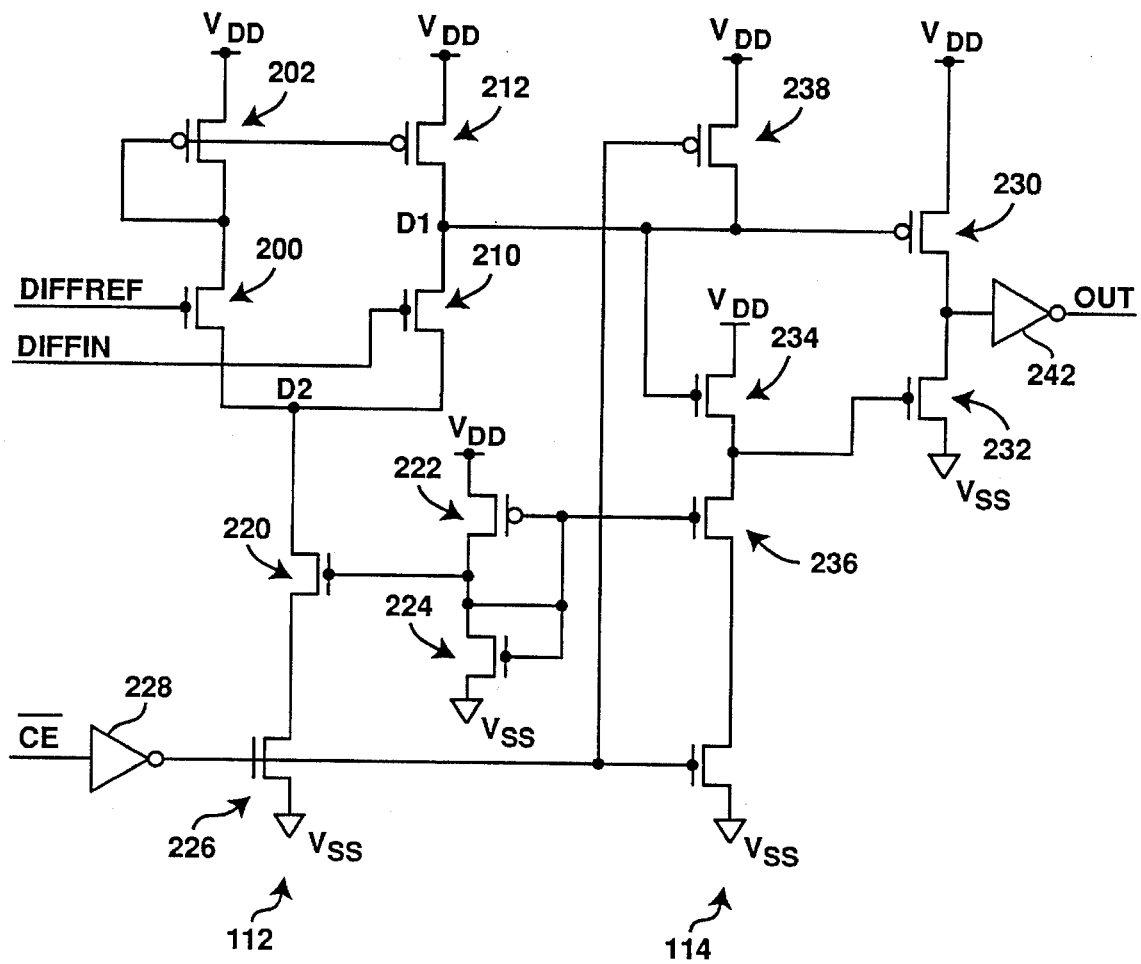
FIG. 7 is a schematic diagram of a differential stage and an output stage of a sense amplifier according to an embodiment of the invention.

Referring now to FIG. 7, there is shown the differential and output stages 112, 114 of the sense amplifier circuit according to an embodiment of the present invention. The differential stage 112 comprises differential transistors 200 and 210 coupled to receive the DIFFREF and DIFFIN signals, respectively, from the input stage circuit 110. The differential transistors 200, 210 are NMOS transistors coupled together at their source nodes to the drain of a current source transistor 220. The source of the current source transistor 220 is coupled to the supply voltage $V_{SS}$ by way of an NMOS enabling transistor 226, which is controlled by the chip enable signal by way of an inverter 228. The drain nodes of differential transistors 200, 210 are coupled via respective PMOS load devices 202, 212 to the supply voltage $V_{DD}$. The PMOS load devices 202, 212 both have their gate nodes coupled to the drain of the load device 202, so as to form an active load as is known to those in the art. The current source transistor 220 is controlled by a biasing network comprising a PMOS transistor 222 and NMOS transistor 224. The transistors 222, 224 are coupled in series between the voltage supplies $V_{DD}$ and $V_{SS}$, and have their gate nodes coupled to the common node formed between the transistors 222 and 224.

The differential amplifier stage 112 has a single-ended output from a node $D_1$ between the differential transistor 210 (controlled by DIFFIN) and load device 212, which is coupled to the gate of a PMOS pull-up transistor 230 of the output stage 114. The drain of pull-up transistor 230 is coupled to an output inverter 242, as is the drain of a pulldown NMOS transistor 232. The pulldown transistor 232 is driven from a level-shifting network comprising series NMOS transistors 234 and 236. The transistor 234 is coupled from supply voltage $V_{DD}$ to the case of pulldown transistor 232, and is controlled from the differential output at node $D_1$. The transistor 236 of the level-shifting network receives a gate network from the biasing network of transistors 222, 224, and is coupled from the gate of pulldown transistor 232 to voltage supply $V_{SS}$, by way of an enabling transistor 240 controlled by the inverted chip enable signal from inverter 228. Another enabling transistor 238 is also controlled from the output of inverter 228 and is coupled between differential output node D1 and supply voltage $V_{DD}$, so as to pull node $D_1$ up to $V_{DD}$ when the sense amplifier is inactive (chip enable signal is high).

It is apparent from the foregoing that the described embodiments of the present invention provide a number of advantages over the prior art pseudo-differential sense amplifier described herein above. These advantageous features and effects are summarized below:

Cascode transistors and other active devices are matched as between the reference and array side cascode circuits of the input stage which results in better reference voltage centering across power supply, temperature, and manufacturing process variations.

Two leaker transistors contributing twice the leaker current on the reference side cascode circuit in the input stage in order to cancel biasing leaker current variation between the reference and array sides of the input stage.

Matched clamping circuits are provided on each side of the input stage to allow higher and more effective clamping voltage and to improve sense amplifier speed.

PMOS diode loads are utilized in the input stage cascode circuits, which allows better modeling accuracy during design of the sense amplifier because the load devices are not subject to the body effect.

Improved chip enable speed and avoidance of power-on glitch by providing:
 bitline discharge transistors to ensure that both array and reference bitlines fully discharge to ground when the sense amplifier is inactive.
 separated DIFFIN and DIFFREF inputs to the sense amplifier differential stage by conditioning the clamping circuits on the chip enable (CE) signal and delaying CE to the array side clamping circuit, so as to avoid inadvertent sense amplifier switching in the presence of noise or supply fluctuations.

Selectable cascode transconductance and cascode circuit loading effect to enable selectable speed and cascode and/or bitline swing.

Single ended differential output which enables use of a smaller and more power efficient output stage.

In order to provide the control voltages to the input stage circuit 110, such as $V_{CASC1}$, $V_{CASC2}$, $V_{CLAMP}$ and $V_{LEAK}$, the memory circuit in which the sense amplifier is incorporated may include a voltage generation circuit, as is known to those of ordinary skill in the art. By way of example, for a sense amplifier circuit operating on a nominal 5 volt supply (i.e. $V_{DD}$ =5 volts, $V_{SS}$=ground) $V_{CASC1}$, and $V_{CASC2}$, may be of the order of 2.5 volts, $V_{CLAMP}$ around 2.2. volts, and $V_{LEAK}$ about 1.9 volts. Listed below is also an example of the relative sizes of some of the transistor width-to-length ratios for the sense amplifier circuit illustrated in FIGS. 6 and 7.

| Cascode transistors (W/L) | 124 2*32.5/1 | 154 2*32.5/1 | 125 2*10/1 | 155 2*10/1 |
|---|---|---|---|---|
| PMOS cascode loads (W/L) | 122 6/1 | 152 12.3/1 | 123 4.4/1 | 153 8.6/1 |
| Clamping transistors (W/L) | 136 6*30/0.8 | 166 6*30/0.8 | | |
| Leaker transistors (W/L) | 145 2/9 | 175 2/9 | 176 2/9 | |
| Differential transistors (W/L) | 200 35/0.8 | 210 35/0.8 | | |
| Differential loads (W/L) | 202 4*11.25/0.8 | 212 4*11.25/0.8 | | |
| Current source transistor (W/L) | 220 30/1.6 | | | |
| Level shifting transistors (W/L) | 234 6.6/0.8 | 236 5.5/3.2 | | |
| Output transistors (W/L) | 230 25/0.8 | 232 7.5/0.8 | | |

It will be appreciated by those skill in the art that the foregoing detailed description of the invention has been put forward by way of example only, and that many modifications can be made to the described construction while remaining within the spirit and scope of the present invention as defined in the claims appended hereto.

What is claimed is:

1. A sense amplifier for sensing a binary state of a memory device, the sense amplifier comprising:

an input stage comprising first and second cascode circuits, the first cascode circuit having a first load device and a first cascode device coupled in series with a memory cell storage device to be sensed, the second cascode circuit having a second load device and a second cascode device coupled in series with a memory cell reference device, wherein said memory cell reference device is of substantially the same construction as said memory cell storage device but in a predetermined logic state;

first and second clamping circuits coupled to said first and second cascode circuits, respectively, said first and second clamping circuits clamping a node of said first and second cascode circuits to one of a first voltage and a second voltage according to an enable input signal;

a differential stage comprising a differential amplifier circuit having first and second differential inputs coupled to receive signals from said first and second cascode circuits respectively; and an output stage coupled to said differential stage to receive an output signal therefrom and for generating a logic level output signal in accordance with the signal received from said differential stage.

2. A sense amplifier as claimed in claim 1, wherein said memory cell storage device is coupled to said first cascode circuit by way of a memory array bitline, said first clamping circuit receiving said enable signal and being coupled to discharge said array bitline to said first voltage when said enable signal indicates an inactive state of the sense amplifier and to clamp said array bitline to said second voltage when the sense amplifier is in an active state.

3. A sense amplifier as claimed in claim 2, wherein said first clamping circuit is coupled to receive said enable signal by way of a delay element, and wherein said memory cell reference device is coupled to said second cascode circuit by way of a reference bitline, said second clamping circuit receiving said enable signal and being coupled to said reference bitline, such that said reference bitline is clamped to said first or second voltage in advance of said array bitline due to the delay of said enable signal received by the first clamping circuit.

4. A sense amplifier as claimed in claim 3, wherein said memory array bitline is coupled to said first cascode circuit and said first clamping circuit by way of an array column select circuit, and wherein said reference bitline is coupled to said second cascode circuit and said second clamping circuit by way of a reference column select circuit.

5. A sense amplifier as claimed in claim 2, wherein said first cascode device comprises a transistor having a first conduction node coupled to said array bitline through an array column select circuit and a second conduction node coupled to said first load device, and having a control node coupled to receive a cascode control voltage, said first clamping circuit being coupled to said first conduction node of said first cascode device.

6. A sense amplifier as claimed in claim 5, wherein said first and second load devices comprises p-type MOS transistors, said first load device having a first conduction node and control node coupled to said second conduction node of said first cascode device, and having a second conduction node coupled to receive a first supply voltage.

7. A sense amplifier as claimed in claim 6, wherein said array column select circuit comprises at least one series connected select transistor for selecting input to said sense amplifier, coupled between said memory cell storage device and said first conduction node of said first cascode device.

8. A sense amplifier as claimed in claim 7, wherein said first cascode circuit includes a first leaker transistor coupled to draw a bias current through said first load device, said first cascode device and said at least one select transistor.

9. A sense amplifier as claimed in claim 8, wherein said first load device is coupled to said first supply voltage by way of a supply enabling transistor controlled by said enable signal so as to connect said first load to said first supply voltage when the sense amplifier is in an active state and to isolate said first load device from said first supply voltage when the sense amplifier is in an inactive state.

10. A sense amplifier as claimed in claim 5, wherein said memory cell reference device is coupled to said second cascode circuit by way of a reference bitline, said second cascode device comprising a transistor having characteristics matching said first cascode device transistor and having a first conduction node coupled to said reference bitline through a reference column select circuit, a second conduction node coupled to said second load device, and having a control node coupled to receive said cascode control voltage, said second clamping circuit being coupled to said first conduction node of said second cascode device to discharge said reference bitline to said first voltage when said enable signal indicates an inactive state of the sense amplifier and to clamp said reference bitline to said second voltage when the sense amplifier is in an active state.

11. A sense amplifier as claimed in claim 9, wherein said memory cell reference device is coupled to said second cascode circuit by way of a reference bitline, said second cascode device comprising a transistor having characteristics matching said first cascode device transistor and having a first conduction node coupled to said reference bitline through a reference column select circuit, a second conduction node coupled to said second load device, and having a control node coupled to receive said cascode control voltage, said second clamping circuit being coupled to said first conduction node of said second cascode device to discharge said reference bitline to said first voltage when said enable signal indicates an inactive state of the sense amplifier and to clamp said reference bitline to said second voltage when the sense amplifier is in an active state, and wherein said second load device comprises a p-type MOS transistor having a first conduction node and control node coupled to said second conduction node of said second cascode device, and having a second conduction node coupled to receive said first supply voltage by way of said supply enabling transistor.

12. A sense amplifier as claimed in claim 11, wherein said second clamping circuit comprises a second discharge transistor coupled between said first conduction node of said second cascode device and a second supply voltage, and a second clamping transistor coupled with a second clamp enabling transistor to clamp said first conduction node of said second cascode transistor to said second voltage, said second clamp enabling transistor being coupled to receive said enable signal, and wherein said first clamping circuit comprises a first discharge transistor coupled between said first conduction node of said first cascode device and said second supply voltage, and a first clamping transistor coupled with a first clamp enabling transistor to clamp said first conduction node of said first cascode transistor to said second voltage, said first clamp enabling transistor being coupled to receive said enable signal by way of at least one delay element so as to delay the clamping action of said first clamping transistor with respect to said second clamping transistor.

13. A sense amplifier as claimed in claim 1, wherein said first and second cascode circuits further comprise third and fourth cascode devices coupled in parallel with said first and second cascode devices respectively, said first and second cascode devices being controlled by a first cascode control voltage signal and said third and fourth cascode devices being controlled by a second cascode control voltage signal applicable separately to said first cascode control voltage signal.

14. A sense amplifier as claimed in claim 6, further comprising third and fourth p-type MOS load devices coupled so as to be selectively connected in parallel with said first and second load devices, respectively, in accordance with a configuration signal.

15. A sense amplifier for sensing a binary state of a memory device, the sense amplifier comprising:

a differential amplifier circuit having first and second inputs and a first output;

an output circuit coupled to said differential amplifier circuit for converting a signal on said first output to a logic level voltage output signal;

a reference input circuit coupled to the first input of said differential amplifier circuit, the reference input circuit comprising a first cascode circuit coupled to a memory cell reference device, and a first clamping circuit for clamping a node of said first cascode circuit to one of a first voltage and a second voltage according to an enable signal input;

a sense input circuit coupled to the second input of said differential amplifier circuit, the sense input circuit comprising a second cascode circuit coupled to a memory cell storage device to be sensed, and a second clamping circuit for clamping a node of said second cascode circuit to one of a first voltage and a second voltage according to said enable signal input; and a delay circuit coupled to said sense input circuit, said delay circuit delaying input of said enable signal to said second clamping circuit with respect to said first clamping circuit.

16. A CMOS sense amplifier for sensing a binary state of a memory cell storage device coupled to an array bitline in an array of memory cells of a memory circuit, the sense amplifier comprising:

an array cascode circuit comprising a first load device coupled from a first voltage source to a differential input node, and an array cascode transistor coupled from the differential input node to said memory cell storage device by way of said array bitline;

a reference cascode circuit comprising a second load device coupled from said first voltage source to a differential reference node, and a reference cascode transistor coupled from the reference differential node to a reference memory cell device in a predetermined binary state by way of a reference bitline;

a reference bitline clamping circuit having an input coupled to receive an enable signal, and coupled to clamp said reference bitline to a clamp voltage according to the enable signal at said input;

an array bitline clamping circuit having an input coupled to receive a delayed enable signal, corresponding to said enable signal and delayed with respect thereto, and coupled to clamp said array bitline to said clamp voltage according to said delayed enable signal;

a differential amplifier circuit comprising a current source circuit, a third load device coupled between said first voltage source and a differential output node, an array differential transistor coupled between said third load device and said current source circuit and having a control node coupled to said differential input node, and a fourth load device and reference differential transistor coupled in series between said first voltage source and said current source circuit, said reference differential transistor having a control node coupled to said reference differential node; and an output circuit comprising a p-type pull-up transistor coupled between said first voltage supply and a sense output node and having a control node coupled to said differential output node, and a pull-down circuit coupled between said sense output node and a second voltage supply and being controlled from said differential output node.

17. A memory circuit comprising:

an array of memory cell storage devices;

an array bitline coupled to a memory cell storage device in said array;

a reference cell device coupled to a reference bitline; and a sense amplifier having an array input coupled to said array bitline, a reference input coupled to said reference bitline, and a sense amplifier output, the sense amplifier comprising:

first and second cascode transistors, said first cascode transistor being coupled from a first load device to said array input and said second cascode transistor being coupled from a second load device to said reference input;

first and second clamping circuits, said second clamping circuit being coupled to said reference bitline for clamping said reference bitline to a clamping voltage on receipt of a first enable signal, and said first clamping circuit being coupled to said array bitline for clamping said array bitline to said clamping voltage on receipt of a second enable signal delayed with respect to said first enable signal;

a differential amplifier circuit having first and second inputs and a single-ended output, said first input being coupled to the junction of said first load device and said first cascode transistor, and said second input being coupled to the junction of said second load device and said second cascode transistor; and an output circuit providing said sense amplifier output and comprising a pull-up circuit and a pull-down circuit having respective inputs coupled to said differential amplifier single-ended output.

18. A memory circuit as claimed in claim 17, wherein each clamping circuit includes a bitline discharge transistor having one conduction node coupled to a first voltage supply, and the other conduction node coupled to the respective reference and array bitlines through column select circuitry, the bitline discharge transistor of the first clamping circuit being controlled by said first enable signal and the bitline discharge transistor of said second clamping circuit being controlled by said second enable signal.

19. A memory circuit as claimed in claim 18, wherein each clamping circuit includes a clamping transistor having one conduction node coupled to the respective reference and array bitline through said column select circuitry, the other conduction node coupled to a second voltage supply by way of a clamp enabling transistor, and its control node coupled to a clamping voltage source, wherein the clamp enabling transistor of the first clamping circuit is coupled so as to be controlled by said first enable signal and said clamp enabling transistor of said second clamping circuit is coupled so as to be controlled by said second enable signal, wherein said first and second enable signals are effective to turn off the respective first and second discharge transistors and turn on the respective first and second clamp enable transistors so that the voltage on the respective reference and array bitlines rise from said first voltage supply level to a clamp voltage determined by the clamping voltage source.

20. A memory circuit as claimed in claim 19, further comprising a delay circuit coupled to receive said first enable signal as input, and output said second enable signal delayed with respect to said first enable signal.

21. A memory circuit as claimed in claim 20, wherein said delay circuit comprises an even numbered plurality of series connected inverter circuits.

22. A memory circuit as claimed in claim 17, wherein said second load device of said reference side cascode circuit provides a loading effect which is less than the loading effect of said load device of said array side cascode circuit, and wherein said array side cascode circuit includes a leaker transistor to provide bias current through said first load device and first cascode transistor, and said reference side cascode circuit includes a matching leaker transistor as well as an additional leaker transistor coupled between the reference side load and cascode transistor in order to draw additional current through the reference side load so as to match the voltage drop across the first and second load devices.

23. A memory circuit as claimed in claim 17, wherein third and fourth cascode transistors are provided in parallel with said first and second cascode transistors, respectively, said first and second cascode transistors being controlled by a first control voltage and said third and fourth cascode transistors being controlled by a second control voltage.

24. A memory circuit as claimed in claim 17, wherein third and fourth load devices are provided, the third and fourth load devices being selectively connectable in parallel with said first and second load devices, respectively, in accordance with a configuration signal.

25. A memory circuit as claimed in claim 24, wherein said first, second, third and fourth load devices comprise p-type MOS transistors coupled as diode loads.

26. A sense amplifier having an array input coupled to a memory cell storage device, a reference input coupled to a reference memory cell, and a sense amplifier output, the sense amplifier comprising:

first and second cascode circuits having matching first and second cascode transistors, respectively, said first cascode transistor being coupled from a first load device to said array input and said second cascode transistor being coupled from a second load device to said reference input, said first and second cascode transistors being controlled by a first cascode voltage input;

a cascode variation circuit coupled to said first and second cascode circuits, the cascode variation circuit receiving a cascode control voltage input for varying a transconductance of the first and second cascode circuits;

a differential amplifier circuit having first and second inputs and a first output, said first input being coupled to a first node coupled to said first load device and said first cascode transistor, and said second input being coupled to a second node coupled to said second load device and said second cascode transistor; and an output circuit providing said sense amplifier output and comprising a pull-up circuit and a pull-down circuit having respective inputs coupled to said differential amplifier first output.

27. A sense amplifier as claimed in claim 26, wherein said cascode variation circuit comprises matching third and fourth cascode transistors, said third and fourth cascode transistors being coupled in parallel with said first and second cascode transistors, respectively, and said third and fourth cascode transistors being controlled by said cascode control voltage input.

28. A sense amplifier for sensing a binary state of a memory device, the sense amplifier comprising:

an input stage comprising first and second cascode circuits, the first cascode circuit having a first load device and a first cascode device coupled in series with a memory cell storage device to be sensed, the second cascode circuit having a second load device and a second cascode device coupled in series with a memory cell reference device, wherein said memory cell reference device is of substantially the same construction as said memory cell storage device but in a predetermined logic state, said input stage including a load variation circuit coupled to said first and second cascode circuits and receiving a load variation control signal for varying the load on said first and second cascode circuits;

a differential stage comprising a differential amplifier circuit having first and second differential inputs coupled to receive signals from said first and second cascode circuits respectively; and an output stage coupled to said differential stage to receive an output signal therefrom and for generating a logic level output signal in accordance with the signal received from said differential stage.

29. A sense amplifier as claimed in claim 28, wherein said load variation circuit comprises third and fourth load devices coupled so as to be selectively connected in parallel with said first and second load devices, respectively, in accordance with said load variation control signal.

30. A sense amplifier as claimed in claim 28, wherein said first and second load devices are p-type MOS diode loads.

31. A sense amplifier for sensing a binary state of a memory device, the sense amplifier comprising:

an input stage comprising first and second cascode circuits, the first cascode circuit having a first load device and a first cascode device coupled in series with a memory cell storage device to be sensed, the second cascode circuit having a second load device and a second cascode device coupled in series with a memory cell reference device, wherein said memory cell reference device is of substantially the same construction as said memory cell storage device but in a predetermined logic state, the first and second cascode circuits having respective first and second leaker circuits coupled to draw leaker current so as to provide substantially the same leaker voltage drop across said first and second load devices and substantially the same leaker bias current through said first and second cascode devices;

a differential stage comprising a differential amplifier circuit having first and second differential inputs coupled to receive signals from said first and second cascode circuits respectively; and an output stage coupled to said differential stage to receive an output signal therefrom and for generating a logic level output signal in accordance with the signal received from said differential stage.

32. A sense amplifier as claimed in claim 31, wherein a loading effect of said second load device is about one half of a loading effect of said first load device, and wherein the leaker bias current drawn through said second load device by second leaker circuit is about twice as much as the leaker bias current drawn through said first load device by said first leaker circuit.

33. A sense amplifier for sensing a binary state of a memory device, the sense amplifier comprising:

an input stage comprising first and second cascode circuits, the first cascode circuit having a first load device and a first cascode device coupled in series with a memory cell storage device to be sensed, the second cascode circuit having a second load device and a second cascode device coupled in series with a memory cell reference device, wherein said memory cell reference device is of substantially the same construction as said memory cell storage device but in a predetermined logic state;

a differential stage comprising a differential amplifier circuit having first and second differential inputs coupled to receive signals from said first and second cascode circuits respectively; and an output stage coupled to said differential stage to receive an output signal therefrom and for generating a logic level output signal in accordance with the signal received from said differential stage, the output stage comprising a pull-up circuit coupled to said differential stage to receive said output signal, a level shift circuit coupled to said differential stage to receive said output signal for shifting a voltage level of said output signal, and a pull-down circuit coupled to said level shift circuit to receive the level shifted output signal.

* * * * *